United States Patent Office 2,916,376

Patented Dec. 8, 1959

2,916,376

LIGHT SENSITIVE COATING COMPOSITION

Walter T. Ritter, River Forest, Robert O. Ragan, Oak Park, and Robert F. Trant, Chicago, Ill., assignors to United Biscuit Company of America, Chicago, Ill., a corporation of Delaware No Drawing. Application February 10, 1955 Serial No. 487,452

4 Claims. (Cl. 96—93)

This invention relates to light sensitive compositions, methods for making light sensitive compositions and articles made therefrom.

Certain high molecular weight materials such as gelatine, glue, albumin, shellac and the like when sensitized with dichromate become reactive to light and particularly to actinic light and when exposed to such light undergo physical and chemical changes. One of the most readily detected and useful changes is that which renders the composition insoluble in solvents which formerly readily dissolved it. This property makes the light sensitized material useful in forming protective and decorative coatings on many kinds of surfaces.

The light sensitized materials listed above are in general aqueous solutions and this fact limits the range of application. In many cases it is desirable that the light sensitized material be essentially non-aqueous in character. The materials listed above also require baking, chemical treatment or forced drying to develop a tough cohesive film. Such operations are expensive and are performed only with difficulty on certain objects and particularly on large objects.

The permissive time lapse between coating and exposing these materials is relatively short and a greater range of application could be realized if a longer effective usable period between coating and exposure to light could be used.

It is an important object of the present invention to provide a photosensitive composition which is essentially non-aqueous and comprises comparatively simple chemicals.

Another object of the invention is to provide a photosensitive composition which requires no baking, chemical treatment or forced drying to develop a firm, hard, and tough coating film.

Yet another object of the invention is to provide a photosensitive composition which has a long effective usable period between coating and exposure and in which the unexposed portions do not harden to form scum.

Still another object of the invention is to provide a light sensitive material in which the quality of the exposed image is not substantially adversely affected upon overexposure.

Yet another object of the invention is to provide a light sensitive material which in addition to being sensitive to actinic light is also sensitive to light in the longer wave-length portion of the spectrum.

A further object of the invention is to provide a photosensitive composition which after exposure and development can be subjected to etching solutions, washed, and thereafter further subjected to etching solutions as necessary without adversely affecting the developed composition film.

Still another object of the invention is to provide an improved method of preparing light sensitive compositions from materials which are not ordinarily light sensitive.

Yet another object of the invention is to provide methods of treating materials which are not ordinarily light sensitive when treated with light sensitizing dichromate in such a manner as to render them light sensitive when treated with light sensitizing dichromate.

A further object of the invention is to provide a new compound which is sensitive to light when treated with light sensitizing dichromate, such compound being derived from compounds which are not normally light sensitive when treated with light sensitizing dichromate.

A still further object of the invention is to provide films formed from light sensitive compositions of the type set forth which are resistant to most solvents, firmly adhere to most materials including impervious materials, and can be readily dyed and pigmented.

A further object of the invention is to provide films formed from light sensitive compositions of the type set forth which are translucent and clear in color, which are waterproof and can withstand standard etching acids, which can withstand elevated temperatures, have a glossy fiinsh, and are resistant to abrasion in both the wet and dry conditions.

These and other objects and advantages of the present invention are accomplished by utilizing as the material sensitive to light when treated with light sensitizing dichromate solution a polyhydric compound having attached thereto by an ether linkage a hydrocarbon containing a polymerizable double bond, the substituted polyhydric compound being slightly oxidized. The light sensitive polyhydric compound and a suitable amount of light sensitizing dichromate are dissolved in a common solvent system to form a sensitized solution which preferably after drying is then exposed to light which causes the light sensitive material to become insoluble in the solvent system.

A preferred group of polyhydric compounds suitable for use in the present invention are carbohydrates having certain of the hydroxyl groups thereof esterified with a substituent group so that the substituent group is attached thereto through an ether linkage. The substituent group must contain a polymerizable double bond. Preferably the carbon atom in the substituent group adjacent the ether oxygen is in the α-position to the polymerizable double bond.

Among the carbohydrates useful in the present invention are monosaccharides, disaccharides, trisaccharides, tetrasaccharides and polysaccharides. Examples of monosaccharides useful in the present invention are dioses; trioses including aldotrioses and ketotrioses; tetroses including aldotetroses, ketotetroses and methyl aldotetroses; pentoses including aldopentoses, kepentoses and methyl aldopentoses; hexoses including aldohexoses, ketohexoses and methyl aldohexoses; heptoses; octoses; nonoses; and glucosides and fructosides.

A preferred form of carbohydrates are the polysaccharides including pentosans such as arabinosans, lyxosans, ribosans and xylosans; hexosans including alosans, altrosans, dextrans, galocotsans, gulosans, idosans, levulosans, mannosans, and talosans. Of the polysaccharides the preferred materials are the dextrans including dextrins, glycogen, starch, and cellulose.

Other examples of suitable polyhydric compounds useful in the present invention are glycerols, including ethylene glycol, propylene glycol, butylene glycol, glycerol, diglycerol and triglycerol; higher polyglycerols including erythritol, erythrose, pentaerythritol and dipentaerythritol; and higher polypentaerythritols including 2,2,6,6-tetramethylolcyclohexanol, 3,3,5,5-tetramethylolpyran-4-ol, 3,3,5-trimethylol-5-methylpyran-4-ol, and 3,5-dimethylol-3,5-dimethylpyran-4-ol.

Among the starches useful in the present invention are those obtained from various naturally occurring vegetable sources such as potatoes, wheat, oats, rice, corn and arrowroot.

For purposes of illustration the present invention will be shown applied to starch which has had certain of the hydroxyl groups thereon esterified with a hydrocarbon having a polymerizable double bond therein. Examples of suitable substituent groups are allyl, methallyl, ethylallyl, chloroallyl, crotylallyl, cinnamyl, tiglyl, chlorocinnamyl and bromoallyl. A preferred substituent group is the allyl group.

If a starch is esterified by a compound containing the allyl group, the resultant product is commonly called allyl starch. The following is a suitable method for producing allyl starch for use in the present invention.

*Example I*

A suitable starch such as corn starch was chosen and 36 grams of the corn starch are wet with 10 ml. of 99% isopropanol. 64 grams of a 50% solution of sodium hydroxide in water were added and the resultant mixture stirred vigorously. The mixture was then placed in a flask and 380 grams of allyl bromide were added. The mixture was heated and refluxed for 90 minutes. The excess allyl bromide and any accompanying impurities were then removed by steam distillation and the resultant product washed in warm water. The yield was 19 grams of allyl starch.

When the allyl starch prepared by the above method was dried in the absence of oxygen, the resulting product displayed no light sensitive properties after being sensitized with dichromate and exposed to light. It has been found that this non-sensitive material can be rendered light sensitive according to the present invention by slightly oxidizing the product before sensitizing with a light sensitive dichromate solution.

One preferred method of oxidation is to heat the dry allyl starch at an elevated temperature for several hours in the presence of atmospheric oxygen and preferably in the dark. For example the allyl starch made as described above was dried at a temperature of 120° C. for 48 hours in a dark oven. The resultant partially oxidized product was found to be light sensitive when sensitized with a suitable dichromate sensitizing solution.

Another preferred method of slightly oxidizing the allyl starch is to treat a solution of the allyl starch with an oxidizing agent, preferably a peroxide. For example a portion of the allyl starch prepared as above was dissolved in an equal weight of proprietary anhydrous ethyl alcohol. To the alcohol solution of allyl starch was added ½% by volume of 30% hydrogen peroxide solution in water. The resultant mixture was heated on a water bath at 100° C. under refluxing conditions for 1 hour. The partially oxidized allyl starch was then separated from the solution. This product was found to be photosensitive when dissolved in a solvent and sensitized with dichromate, although the original unoxidized allyl starch was not appreciably light sensitive.

When partially oxidizing the allyl starch using atmospheric oxygen, a temperature slightly greater than or less than 120° C. can be successfully used. The only limit placed on the highest suitable temperature is the fact that the starch begins to oxidize sufficiently rapidly to burn. If lower temperatures are utilized, then the length of treatment should be increased.

If hydrogen peroxide is used to oxidize partially the allyl starch, more or less hydrogen peroxide may be used. For example, as much as 0.7% of 30% hydrogen peroxide solution in water may be used instead of the 0.5% disclosed above. Care must be taken to limit the amount of hydrogen peroxide used so that the alcohol solution of allyl starch does not gel. Any amount of hydrogen peroxide short of that required to cause gelation of the alcohol solution of allyl starch is effective. In general the higher the degree of oxidation short of gelation, the greater the light sensitivity of the partially oxidized allyl starch. Accordingly, if the amount of hydrogen peroxide is reduced in the above described reaction, the degree of light sensitivity will also be reduced.

A photosensitive coating material can be made from allyl starch partially oxidized by either of the above described methods. It is preferred first to dissolve the partially oxidized allyl starch in denatured anhydrous ethyl alcohol, the solution being 50% allyl starch and 50% alcohol by weight. A preferred photosensitive solution incorporating this alcohol solution of starch therein has the following composition:

*Example II*

| Ingredient | Percent by Weight |
|---|---|
| 50% solution allyl starch in denatured anhydrous ethyl alcohol | 16.9 |
| Butyl phthalyl butyl glycollate ("Santicizer B-16") | 1.1 |
| Phenol formaldehyde and maleicglyceride type resin ("Amberol 750") | 2.9 |
| Toluol | 4.4 |
| Proprietary denatured anhydrous ethyl alcohol | 34.8 |
| Butyl acetate | 2.5 |
| Ethylene glycol monoethyl ether ("Cellosolve") | 14.4 |
| Xylol | 15.4 |
| Ammonium Dichromate | 0.2 |
| Water | 7.4 |
| | 100.0 |

The percentage of oxidized allyl starch in the original anhydrous alcohol solution may be slightly more or less than the 50% disclosed. Sufficient alcohol must be used to insure substantially complete dissolution of the oxidized allyl starch.

The butyl phthalyl butyl glycollate is included to serve as a plasticizer and to improve the properties of the resultant film. Any other suitable plasticizer of the same general type can be included and substituted for this material.

The purpose of the resin ("Amberol 750") is to add firmness and hardness to the dried film and to improve the adhesion to the supporting surface if the supporting surface is metal. Other resins of a similar type and useful for similar purposes can be substituted for that given for purposes of illustration. For example the resin sold under the trade name "Krumbhaar 1717" may be used.

The purpose of the toluol, butyl acetate, ethylene glycol monoethyl ether, and xylol is to prevent "blushing" upon evaporation of the solvents to form a dry photosensitive layer. The purpose of the additional anhydrous ethyl alcohol is to dilute the light sensitive solution thereby making it more easily applied.

The ammonium dichromate serves as a light sensitizing agent. Other suitable light sensitizing dichromate compounds may be used but none have substantial solubility in the solvents utilized to make up the light sensitive coating composition. The amount of ammonium dichromate can be reduced slightly but the light sensitizing after a certain point is also reduced. A greater amount of ammonium dichromate may be used but such an increase does not substantially increase the light sensitivity of the coating composition.

The purpose of the water in the formulation for the light sensitive coating composition is to insure at least the required minimum solubility of the ammonium dichromate in the final composition. Although the ammonium dichromate is slightly soluble in other of the solvents present, the addition of the water greatly increases the amount of active and available ammonium dichromate.

The light sensitive coating composition illustrated can be used for many purposes. One important use is the decoration of various materials such as glass, metal, plastics and the like. A specific example of such a use is the decoration of electric light bulbs such, for example, as Christmas tree lights. A clear and uncolored Christmas tree light bulb can be decorated by first applying a coating of the light sensitized solution to the outside of the bulb. The solvents are permitted to evaporate leaving a solid light sensitive layer. The bulb may be lighted whereby to provide light to react or set the light sensitive coating. Alternatively a mask may be placed over the unreacted coating and the portions not covered by the mask can be subjected to light whereby to cause hardening of the coating in these areas. The unhardened portions of the coating (those covered by the mask and therefore not exposed to the light) are then removed by dissolving them in denatured anhydrous ethyl alcohol. The resultant product is a decorated light bulb having a decoration thereon corresponding to the areas exposed to light.

Actinic light may be used in hardening the light sensitive coatings of this invention by exposing the suitably masked coating to a 90 amp. dual actinic light at a distance of 36 inches for 30 seconds or more. An important advantage of the light sensitive compositions of this invention is the fact that substantial over-exposure does not adversely affect the developed exposed area.

Instead of actinic light a 750 watt projector bulb may be used by placing the coating to be hardened at a distance of 2 inches from the bulb and exposing for 2 minutes or more.

Various decorative effects can also be obtained by coloring the light hardened coating with dyes or with pigments. When coloring with dyes, it is preferred that a dye be used which can be dissolved in alchohol or ester type solvents. The dye solution may be incorporated in the developing solution used to remove the unexposed photosensitive coating or may be applied after development of the exposed portions of the coating while the coating is wet or may be applied after the developed portions of the coating have been dried. The excess dye is removed with a wash solution. The wash solution should be preferably not too miscible with the dye solvent and should not soften the exposed and hardened portions of the coating. A suitable wash solution is water.

Typical dyes useful in dyeing the exposed hardened portions of the coatings made in accordance with the present invention are methyl violet, calcozine magenta xx, Victoria Blue B Concentrate, and the like. The best results are obtained when the exposed and developed image on the light sensitive coating is dyed immediately after development and before drying.

The film formed as described above was translucent and clear in color before dyeing. The finish of the film was glossy and the film was waterproof and resistant to abrasion.

Various plastic materials can also be coated using the sensitized film forming composition described above. For example a sheet of plastic was coated with a sensitized allyl starch film. After the film had dried it was exposed through a photographic negative to actinic light as described above for 90 seconds. The resultant image was then developed by washing with denatured ethyl alcohol. A tightly adhering glossy film was formed on the plastic on those portions which were exposed to actinic light through the negative. Certain samples made in this manner were dyed as described above to form colored patterns upon the supporting plastic sheet.

Another application for the light sensitive coating composition of the present invention is in lining containers such as metal cans. The film formed by the composition of the present invention is highly resistive to certain materials such as acids which are particularly harmful to metal containers. A metal can was treated according to the present invention by spraying a sensitized solution of partially oxidized allyl starch on the surface of the can (the interior) which it was desired to coat and to protect. After permitting the coating to dry for one hour, the coating was exposed to actinic light for 90 seconds in the manner previously described. The resultant film was impervious and had a glossy finish.

Another application for the present invention is in the finishing of furniture and particularly wooden furniture. A partially oxidized allyl starch solution which had been sensitized with dichromate solution was applied to a piece of wooden furniture to be finished. After the applied coating had dried it was exposed to actinic light in the usual manner for 90 seconds. The resultant film was hard, closely adhering and had a glossy finish. Such a film is useful as a filler coating and also as a semi-finishing or finishing coating. If decoration is desired the coating can be dyed in the manner described previously.

It has further been found that the present invention has particular utility when applied in the field of metal plating. Often it is desired to plate certain portions of a metal surface while other portions are protected from the plating solutions. Various coatings have been used for this purpose heretofore but such coatings have had certain disadvantages in that they were difficult to apply in a precise manner and often could not withstand prolonged contact with the plating solutions since the plating solutions usually contained highly corrosive acidic materials. By use of the present invention predetermined portions of a metal surface can be accurately covered and protected for prolonged periods of time from the action of the plating baths. For example if it is desired to plate a particular design on a metal surface, a photographic negative of the design is first prepared. The metal surface is then coated with a sensitized and partially oxidized allyl starch solution in alcohol made in accordance with the present invention. After the allyl starch coating was dried it was exposed to a 90 amp. dual actinic light at a distance of 36 inches for 90 seconds. Immediately after exposure the allyl starch coating was washed with denatured ethyl alcohol. The alcohol dissolved and floated away the portions of the allyl starch coating which had been covered by the opaque portions of the photographic negative. The plate was then dyed. The exposed portions of the coating remained adhered to the metal plate and formed a smooth and accurate outline of the desired design. The coated plate was air dried and then immersed in a plating solution and connected in circuit with a source of plating material and an electrical supply. After a predetermined length of plating operation, the plate was withdrawn, washed and the newly plated metal examined. In those cases where it was deemed desirable, the plate was again deposited in the plating bath and further plating carried out. The hardened allyl starch film proved to be highly resistive to the acid plating bath and further withstood successfully the scrubbing, inspection, and the following further deposition of plating metal. After the desired amount of plating metal had been deposited, the adherent allyl starch film was removed by buffing and scrubbing with harsh abrasive materials. The plated pattern had a firm clear outline as had been defined by the hardened allyl starch. Furthermore the plated metal was firmly adhered to the underlying metal plate since no scum was left by the placement of the design on the metal plate using the partially oxidized allyl starch of the present invention.

It has been further found that the present invention is particularly useful in the etching of metal surfaces for example in the production of metal engraving plates. A desired image can be etched on a metal surface using a coating of hardened allyl starch made according to the present invention as a material to outline or mask the portions of the plate which are not to be etched. This can be accomplished by first preparing a photographic negative of the material that is to be etched on the metal surface. A coating of the sensitized and partially oxidized allyl starch made according to the present invention was then applied to the metal surface. The coating was then allowed to dry in air at room temperature for one hour. The coating so formed was afterwards exposed through the photographic negative to a 90 amp. dual actinic light at a distance of 36 inches for 90 seconds. Thereafter the photographic negative was removed and the unexposed portions of the allyl starch coating were removed by washing the coating with anhydrous denatured ethyl alcohol. The unexposed portions washed away cleanly leaving no scum and the exposed portions were left unharmed and intact. When desired the coating so formed was dyed using a dye solution of the type described before. The coated and developed metal surface was dried in air and then placed in an etching bath. After a suitable period of treatment with the etching solution, the metal surface was washed and inspected. In those cases where it was deemed desirable the metal surface was again immersed in the etching solution and further etching was carried out.

The protective coating formed by the partially oxidized allyl starch of the present invention firmly adhered to the metal surface throughout the etching operation and even during the subsequent re-etching operation. When half-tone subjects were used, the developed image disclosed that the light sensitive material possessed a high resolving power. It was further found that no baking, chemical treatment, or forced drying was required to develop a hard and tough protective film using the composition of the present invention. In addition the sensitized coating exhibits a long effective useful period. In fact it has been found that suitable images are formed in the coating composition after the coating has dried in the air at room temperature for as little as 30 minutes and after it had stood for as long as 4 hours. This ability to dry quickly in air and the long usable period between coating and exposure provides for great flexibility and convenience in use.

Suitable protective coatings were formed on the metal surface after exposure for as short a time as 30 seconds when the coating was exposed to a 90 amp. dual actinic light at a distance of 36 inches. Longer exposure periods and in fact extreme overexposure did not substantially adversely affect the quality of the exposed image.

Another preferred type of allylated compounds are those formed by allylating dextrins. Dextrins are formed by heating or roasting starch in a controlled manner for from two to about fifteen hours. Dextrin can be allylated in the same manner described above for allylating corn starch. Allyl dextrins are preferred in certain instances since their solubility in certain solvents is substantially greater than the solubility of the corresponding starch. It has been found that a sensitized coating composition of the formula set forth above with respect to allyl starch is also successfully formed from the corresponding allyl dextrin. The coating formed with allyl dextrins have the same uses and possess the same important advantages as the allyl starch described above.

The following is another preferred method of forming an allyl dextrin.

*Example III*

Corn dextrin and sodium hydroxide were mixed in water to form a slurry. The slurry was then placed in an autoclave into which was added allyl chloride under pressure. The reaction was carried out at about 90° C. and was continued for about 5 hours. The reaction mass was then placed in water and washed. The product was then recovered as a hard resin and pulverized. The pulverized product was passed through a dryer at 120° C. The dry product was then dissolved in denatured ethyl alcohol under a nitrogen atmosphere and decolorized by using activated charcoal. The product was then reprecipitated from the solvent, filtered and dried.

The product so formed was then partially oxidized by one of the methods described above with respect to allyl corn starch.

It has also been found desirable in certain instances to increase the solubility of the allyl starch before oxidizing the starch by treatment with acid to produce a degraded allyl starch. Degrading can be most readily accomplished during the manufacture of the allyl starch while the reactants and reaction products are still mixed in the reaction flask. A quantity of concentrated hydrochloric acid in methylethyl ketone is added to the reaction mixture in sufficient quantity to bring the acidity to pH 2–3. The acid mixture is heated and stirred for one hour to produce a degraded allyl starch. The degraded allyl starch was then removed and partially oxidized in one of the manners previously described above.

Allyl starch made as described above in Example I will have approximately 1.7 allyl groups substituted thereon for each glucoside unit. A greater or a less number of allyl groups per glucoside unit may be substituted on the starch. In general the higher the number of substituted allyl groups the greater is the solubility of the allyl starch.

The present invention is equally applicable to allyl derivatives of other types of starch. For example the present invention has been applied to starches derived from wheat using the following method.

*Example IV*

A slurry was made from 50 grams of guar flour sold under the trademark "Galactosol" and 100 grams of potassium hydroxide. The slurry was permitted to stand for several days. The slurry was then placed in a flask and there was added thereto 67 cc. of water, 400 cc. of methylethyl ketone and 300 grams of allyl bromide. This mixture was refluxed in a water bath for 4 hours. The organic layer was then decanted and steam distilled. A gummy product was obtained which was kneaded in warm water and then dissolved in acetone. A small quantity of activated charcoal was stirred into the solution and the solution then filtered. The clear filtrate was stirred into cold water and vigorously agitated. A solid yellow white material was separated and freed from the water.

A solution of the above product from Example IV was made in anhydrous denatured ethyl alcohol, the solution containing 25 parts by weight of allyl wheat starch and 75 parts by weight of alcohol. This solution was then incorporated in the coating composition of Example II above. Exposed and developed coatings made using the allyl wheat starch had all the important properties and advantages described above with respect to allyl corn starch and are useful in the same applications.

Although certain specific examples of light sensitive compositions made according to this invention and certain examples of methods for making light sensitive composition and articles produced therefrom have been given for purposes of illustration, it is to be understood that various changes and modifications can be made therein without departing from the spirit and scope of the invention. Accordingly the invention is to be limited only as set forth in the following claims.

We claim:

1. A light sensitive coating solution comprising a partially oxidized dextrin compound having allyl groups attached thereto by ether linkages, light sensitizing dichromate, and a common solvent system for said compound and said dichromate.

2. A light sensitive coating solution comprising a partially oxidized carbohydrate compound selected from the group consisting of degraded starch and corn starch and wheat starch and dextrin, said compound having an allyl group attached thereto by an ether linkage, light sensitizing dichromate, and a common solvent system for said compound and said dichromate.

3. A light sensitive coating solution comprising a partially oxidized carbohydrate compound selected from the group consisting of degraded starch and corn starch and wheat starch and dextrin, said compound having an allyl group attached thereto by an ether linkage, a metal adhering resin, a plasticizer, light sensitizing dichromate, and a common solvent system for said compound and resin and plasticizer and dichromate.

4. A light sensitive coating solution comprising a partially oxidized dextrin compound having allyl groups attached thereto by ether linkages, a metal adhering resin, a plasticizer, light sensitizing dichromate, and a common solvent system for said dextrin compound and said resin and said plasticizer and said dichromate.

References Cited in the file of this patent

UNITED STATES PATENTS

| | | |
|---|---|---|
| 2,020,901 | Miller | Nov. 12, 1935 |
| 2,312,499 | Lierg | Mar. 2, 1943 |
| 2,328,371 | Wood | Aug. 31, 1943 |
| 2,413,463 | Nichols et al. | Dec. 31, 1946 |
| 2,453,108 | Curtis | Nov. 9, 1948 |
| 2,496,670 | Moe | Feb. 7, 1950 |
| 2,624,673 | Frost et al. | Jan. 6, 1953 |
| 2,645,578 | Wood | July 14, 1953 |

FOREIGN PATENTS

| | | |
|---|---|---|
| 3,385 | Great Britain | of 1912 |